(12) United States Patent
Dorhout et al.

(10) Patent No.: US 10,263,007 B2
(45) Date of Patent: Apr. 16, 2019

(54) METHODS OF FORMING AN ARRAY OF ELEVATIONALLY-EXTENDING STRINGS OF MEMORY CELLS COMPRISING A PROGRAMMABLE CHARGE STORAGE TRANSISTOR AND ARRAYS OF ELEVATIONALLY-EXTENDING STRINGS OF MEMORY CELLS COMPRISING A PROGRAMMABLE CHARGE STORAGE TRANSISTOR

(71) Applicant: Micron Technology, Inc., Boise, ID (US)

(72) Inventors: Justin B. Dorhout, Boise, ID (US); Kunal R. Parekh, Boise, ID (US); Matthew Park, Boise, ID (US); Joseph Neil Greeley, Boise, ID (US); Chet E. Carter, Boise, ID (US); Martin C. Roberts, Boise, ID (US); Indra V. Chary, Boise, ID (US); Vinayak Shamanna, Boise, ID (US); Ryan Meyer, Boise, ID (US); Paolo Tessariol, Arcore (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/002,129

(22) Filed: Jun. 7, 2018

(65) Prior Publication Data
US 2018/0286879 A1  Oct. 4, 2018

Related U.S. Application Data

(62) Division of application No. 15/231,950, filed on Aug. 9, 2016, now Pat. No. 10,014,309.

(51) Int. Cl.
*H01L 21/336* (2006.01)
*H01L 27/11556* (2017.01)
(Continued)

(52) U.S. Cl.
CPC .. *H01L 27/11556* (2013.01); *H01L 27/11519* (2013.01); *H01L 27/11565* (2013.01); *H01L 27/11573* (2013.01); *H01L 27/11582* (2013.01)

(58) Field of Classification Search
CPC ......... H01L 27/10817; H01L 27/10852; H01L 27/10894; H01L 28/91; H01L 29/66181; H01L 27/0207; H01L 21/20
See application file for complete search history.

(56) References Cited

U.S. PATENT DOCUMENTS

| 7,125,781 B2 | 10/2006 | Manning et al. |
| 10,014,309 B2 * | 7/2018 | Dorhout ............ H01L 27/11556 |

(Continued)

*Primary Examiner* — Charles D Garber
*Assistant Examiner* — Abdulfattah B Mustapha
(74) *Attorney, Agent, or Firm* — Wells St. Johns P.S.

(57) ABSTRACT

An array of elevationally-extending strings of memory cells, where the memory cells individually comprise a programmable charge storage transistor, comprises a substrate comprising a first region containing memory cells and a second region not containing memory cells laterally of the first region. The first region comprises vertically-alternating tiers of insulative material and control gate material. The second region comprises vertically-alternating tiers of different composition insulating materials laterally of the first region. A channel pillar comprising semiconductive channel material extends elevationally through multiple of the vertically-alternating tiers within the first region. Tunnel insulator, programmable charge storage material, and control gate blocking insulator are between the channel pillar and the control gate material of individual of the tiers of the control gate material within the first region. Conductive vias extend elevationally through the vertically-alternating tiers in the second region. An elevationally-extending wall is laterally between the first and second regions. The wall comprises the programmable charge storage material and the semiconduc- (Continued)

tive channel material. Other embodiments and aspects, including method, are disclosed.

18 Claims, 9 Drawing Sheets

(51) Int. Cl.
    *H01L 27/11519*     (2017.01)
    *H01L 27/11565*     (2017.01)
    *H01L 27/11582*     (2017.01)
    *H01L 27/11573*     (2017.01)

(56) References Cited

U.S. PATENT DOCUMENTS

2012/0261722 A1   10/2012  Tang et al.
2015/0318296 A1   11/2015  Kim et al.
2017/0278571 A1*  9/2017  Chowdhury ....... G11C 16/0483

* cited by examiner

METHODS OF FORMING AN ARRAY OF ELEVATIONALLY-EXTENDING STRINGS OF MEMORY CELLS COMPRISING A PROGRAMMABLE CHARGE STORAGE TRANSISTOR AND ARRAYS OF ELEVATIONALLY-EXTENDING STRINGS OF MEMORY CELLS COMPRISING A PROGRAMMABLE CHARGE STORAGE TRANSISTOR

This patent resulted from a divisional application of U.S. patent application Ser. No. 15/231,950, filed Aug. 9, 2016, entitled "Methods Of Forming An Array Of Elevationally-Extending Strings Of Memory Cells Comprising A Programmable Charge Storage Transistor And Arrays Of Elevationally-Extending Strings Of Memory Cells Comprising A Programmable Charge Storage Transistor", naming Justin B. Dorhout, Kunal R. Parekh, Matthew Park, Joseph Neil Greeley, Chet E. Carter, Martin C. Roberts, Indra V. Chary, Vinayak Shamanna, Ryan Meyer and Paolo Tessariol as inventors, the disclosures of which are incorporated by reference.

TECHNICAL FIELD

Embodiments disclosed herein pertain to arrays of elevationally-extending strings of memory cells comprising a programmable charge storage transistor and to methods of forming such arrays.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Memory cell strings may be arranged to extend horizontally or vertically. Vertical memory cell strings reduce horizontal area of a substrate occupied by the memory cells in comparison to horizontally extending memory cell strings, albeit typically at the expense of increased vertical thickness. At least some conductive vias of the memory circuitry may need to extend through the increased vertical thickness, for example for connection with control circuitry whether laterally adjacent or under an array of the memory cell strings.

DETAILED DESCRIPTION OF EXAMPLE EMBODIMENTS

Figure 1:
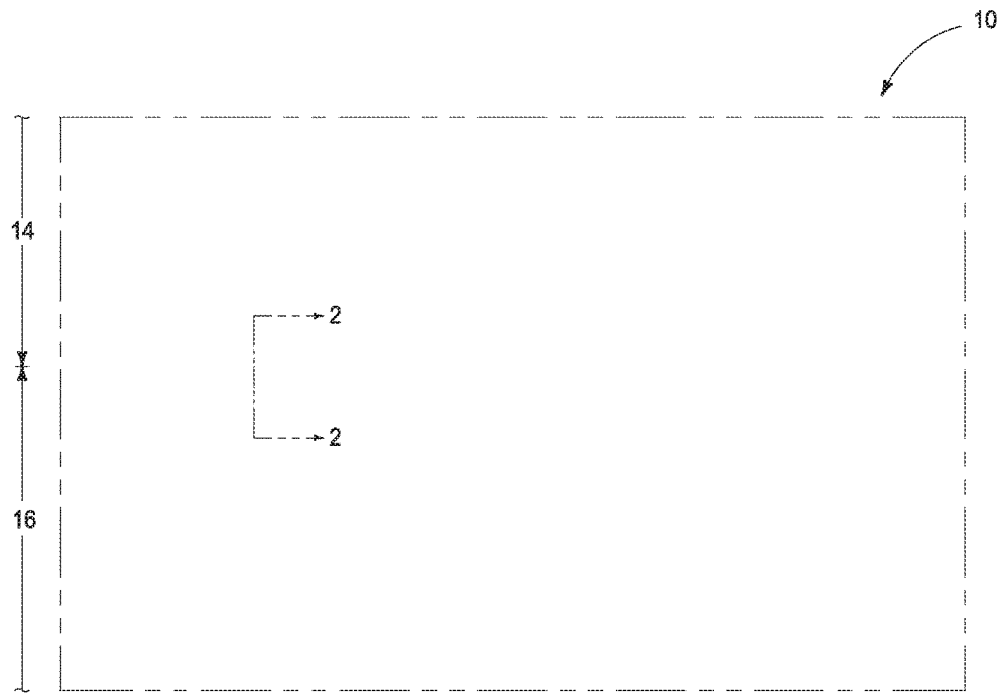
FIG. 1 is a diagrammatic top plan view of a construction comprising an array of elevationally-extending strings of memory cells in fabrication in accordance with an embodiment of the invention.
Figure 2:
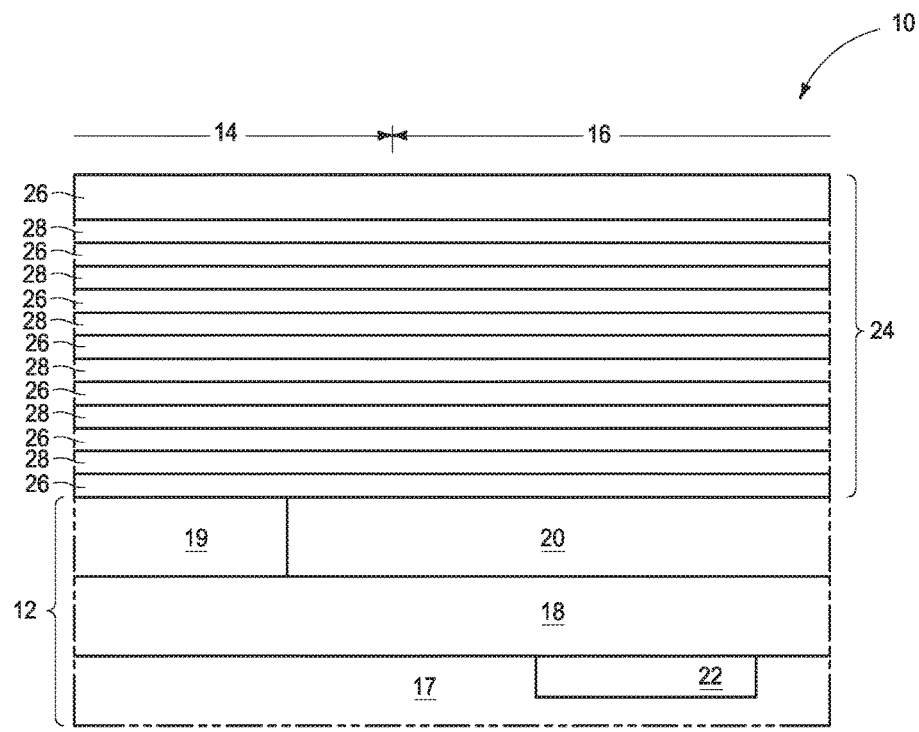
FIG. 2 is a sectional view taken through line 2-2 in FIG. 1.

Embodiments of the invention encompass methods of forming an array of elevationally-extending strings of memory cells and an array of elevationally-extending strings of memory cells independent of the method of manufacture. Regardless, the memory cells individually comprise a programmable charge storage transistor. In this document, "elevationally-extending" and "extend(ing) elevationally" refer to a direction that is angled away by at least 45° from a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further and unless otherwise stated, "elevational(ly)", "higher", "upper", "lower", "top", "atop", "bottom", "above", "below", "under", "beneath", "up", and "down" are generally with reference to the vertical direction. Also, "elevationally-extending" and "extend(ing) elevationally" with respect to a field effect transistor is with reference to orientation of the transistor's channel length along which current flows in operation between the source/drain regions Referring to FIGS. 1 and 2, a substrate fragment or construction 10 may be considered as comprising a base substrate 12 that may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the FIGS. 1 and 2-depicted materials. For example, other partially or wholly fabricated components of integrated circuitry may be provided somewhere above, about, or within substrate 12. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Construction 10 may be considered as comprising a first region 14 that will contain memory cells and a second region 16 that will not contain memory cells and which is laterally of first region 14 (in one embodiment and as shown, immediately laterally-adjacent first region 14). First region 14 and second region 16 may be laterally continuous across a substrate or a memory array area of a substrate, or may only comprise respective parts thereof. First and second regions 14 and 16 may both be part of or within a memory array. Alternately as an example, first region 14 may be part of a memory array and second region 16 may be positioned laterally of a memory array. Regardless, regions 14 and 16 may be used to define horizontal areas that will (14) and will not (16) contain memory cells regardless of the size, shape, etc. of those regions.

Example substrate 12 comprises semiconductor material 17, for example monocrystalline silicon, having a conductively doped source material 19 formed there-over or therein within first region 14 and which may comprise a portion of circuitry for the elevationally-extending strings of memory cells being fabricated. An insulator 20 (e.g., doped or undoped silicon dioxide and/or silicon nitride) is shown laterally adjacent material 19 and extending into second region 16, and an insulator 18 (e.g., doped or undoped silicon dioxide and/or silicon nitride) is shown in first and second regions 14 and 16 elevationally between semiconductor material 17 and materials 19, 20. An example source material 19 is conductively doped polysilicon of about 500 Angstroms thickness over an underlying tungsten silicide of about 900 Angstroms thickness. Insulator 20 may be of the same thickness as source material 19, as shown. An example thickness for insulator 18 is from about 2,000 to 5,000 Angstroms.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials ore regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Semiconductor material 17 is shown as having a conductive region 22 therein within second region 16 and to which a conductive via to be formed will be electrically coupled (in one embodiment directly electrically coupled). In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components.

A stack 24 has been formed over substrate 12 and comprises vertically-alternating tiers of different composition insulating materials 26 and 28. Example such materials are silicon dioxide and silicon nitride regardless of order in the depicted stack of materials. Example thicknesses for each are from about 200 Angstroms to about 400 Angstroms, and such need not be of the same respective thicknesses or of the same thickness relative one another when materials 26 and 28 individually are of constant thickness. Stack 24 is shown as having thirteen vertically-alternating tiers, although fewer or likely many more (e.g., dozens, hundreds, etc.) may be formed. Top layer 26 of stack 24 may be made thicker or thinner than shown or an alternate material provided thereover (not shown) where desired as an etch-stop or polish-stop for better assuring a planar horizontal substrate (if desired). Second region 16 may contain a "staircase" (not shown) wherein "stair-steps" result from at least some of the immediately-adjacent pairs of materials 26 and 28 extending farther in the horizontal direction in an end portion of the stack moving deeper into the stack in the end portion.

Figure 3:
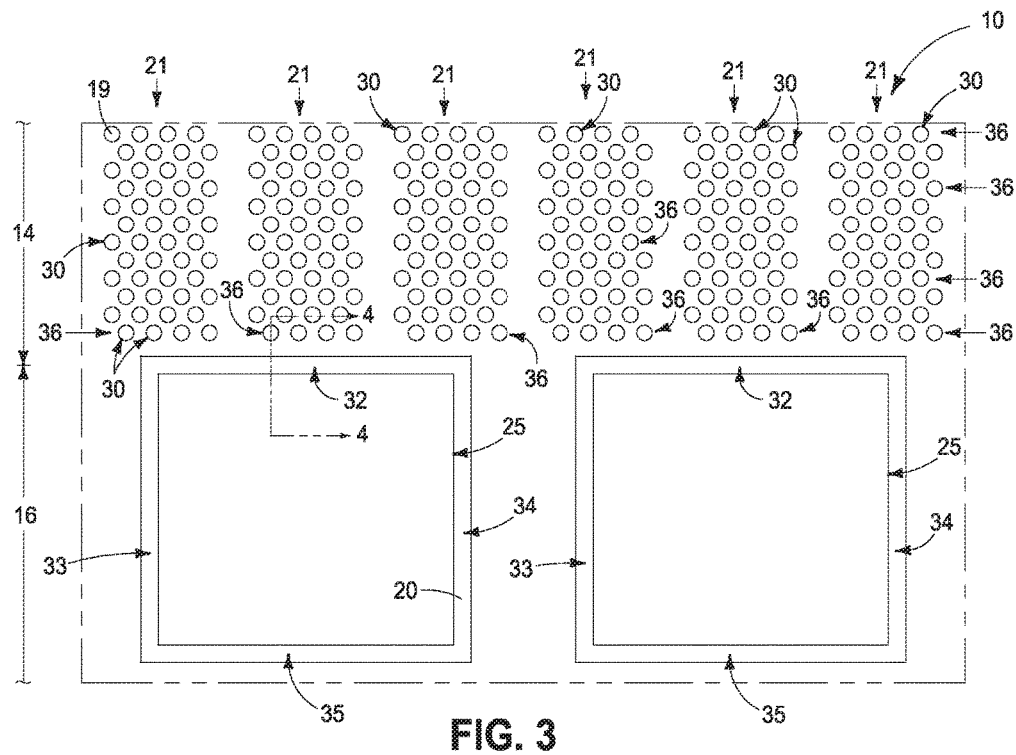
FIG. 3 is a view of the FIG. 1 construction at a processing step subsequent to that shown by FIG. 1.
Figure 4:
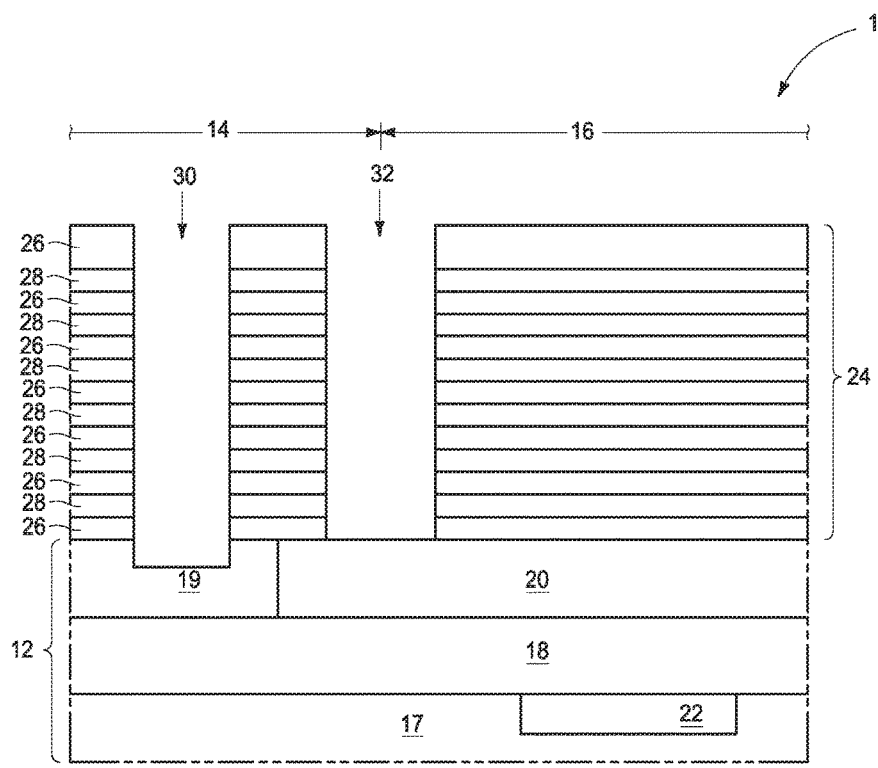
FIG. 4 is a sectional view taken through line 4-4 in FIG. 3.

Referring to FIGS. 3 and 4, elevationally-extending channel openings 30 have been formed through alternating tiers 26, 28 in first region 14. By way of example only, such are shown as being arranged in groups or columns 21 of staggered rows of four openings 30 per row. In one embodiment and as shown, channel openings 30 have been formed into source material 19. Any alternate existing or yet-to-be-developed arrangement and construction may be used. Use of "row" and "column" in this document is for convenience in distinguishing one series or orientation of features from another series or orientation of features and along which components have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

An elevationally-extending wall opening 32 has been formed through alternating tiers 26, 28, and in one embodiment as shown essentially between first and second regions 14, 16. In one embodiment, wall opening 32 may be considered as a first wall opening and at least one additional wall opening is formed (e.g., a second wall opening 33, a third wall opening 34, and/or a fourth wall opening 35) with at least one of such wall openings being angled (i.e., other than the straight angle) relative to first wall opening 32. The additional wall opening may join with the first wall opening, for example each of wall openings 33 and 34 shown as joining with first wall opening 32, and in one embodiment at the horizontal ends of first wall opening 32. In one embodiment, either of wall opening 33 and/or wall opening 34 as joining with first wall opening 32 may be considered as an angling extension of first wall opening 32. In one embodiment and as shown, wall openings 32, 33, 34, and 35 form a radially internal island 25 of alternating tiers 26, 28. Stair-steps (not shown) as described above may be within island 25. Two wall openings 32 (and associated wall openings 33, 34, and 35) are shown in construction 10, although more or only one wall opening 32 (regardless of presence of wall openings 33, 34, and 35) may be used, with the discussion largely proceeding with respect to a single wall opening 32.

Wall opening 32 is laterally spaced from a row 36 of channel openings 30, with wall opening 32 extending horizontally along row 36 aside channel openings 30 in such row. An example row 36 is any one of rows 36 within a column 21 of such rows that is most-proximate wall opening 32. Alternately by way of example only, the row 36 referred to may be considered as the combination of two or more rows 36 in different columns 21 and that are most-proximate wall opening 32. In one embodiment and as shown, wall opening 32 extends along row 36 aside multiple channel openings 30 in the row, in one embodiment along at least four such channel openings in the row, and in one embodiment along more than four channel openings in the row. The example FIGS. 3 and 4 embodiment shows wall opening 32 extending completely across nine channel openings 30, although such may extend across fewer or more channel openings. In one embodiment and as shown, wall opening 32 is formed to be horizontally straight-linear, although curvilinear, a combination of straight-linear and curved segments, etc. may be used. Regardless and in one embodiment, wall opening 32 is formed to be parallel with row 36 and in one embodiment row 36 is horizontally straight-linear.

Example techniques for forming channel openings 30 include photolithographic patterning and etch with or without pitch multiplication. Openings 30 and 32 may each be formed using a single masking step, and may be formed at the same time using the same single masking step such that two or more masking steps are not used for forming openings 32 and 30. Analogously, in one embodiment openings 33, 34, and 35 are formed commensurate with the forming of wall opening 32 and channel openings 30. In one embodiment, channel openings 30 and wall opening 32 are formed to be vertical or within 10° of vertical. Channel openings 30 and wall opening 32 are shown as comprising straight and vertical sidewalls in the depicted vertical cross-section, although such need not and may not be so. Further and regardless, channel openings 30 individually may be circular, ellipsoidal, rectangular, or of other shape in horizontal cross-section. As but one example, a channel opening 30 may be substantially circular having a maximum horizontal open dimension of from about 850 to 1,250 Angstroms at its elevationally-outmost portion and which tapers (not shown) to a horizontal open dimension of about 5% to 10% less at its elevationally innermost portion where meeting with source material 19. Wall opening 32 analogously may have its minimum horizontal open dimensions analogous to that of the maximum horizontal dimension of channel openings 30, and may also taper (not shown). The maximum and minimum respective horizontal open dimensions of channel openings 30 and wall opening 32 need not be the same relative one another. Further, where additional wall openings are formed (e.g., 33, 34, 35), such need not have the same dimensions as that of wall opening 32.

Figure 5:
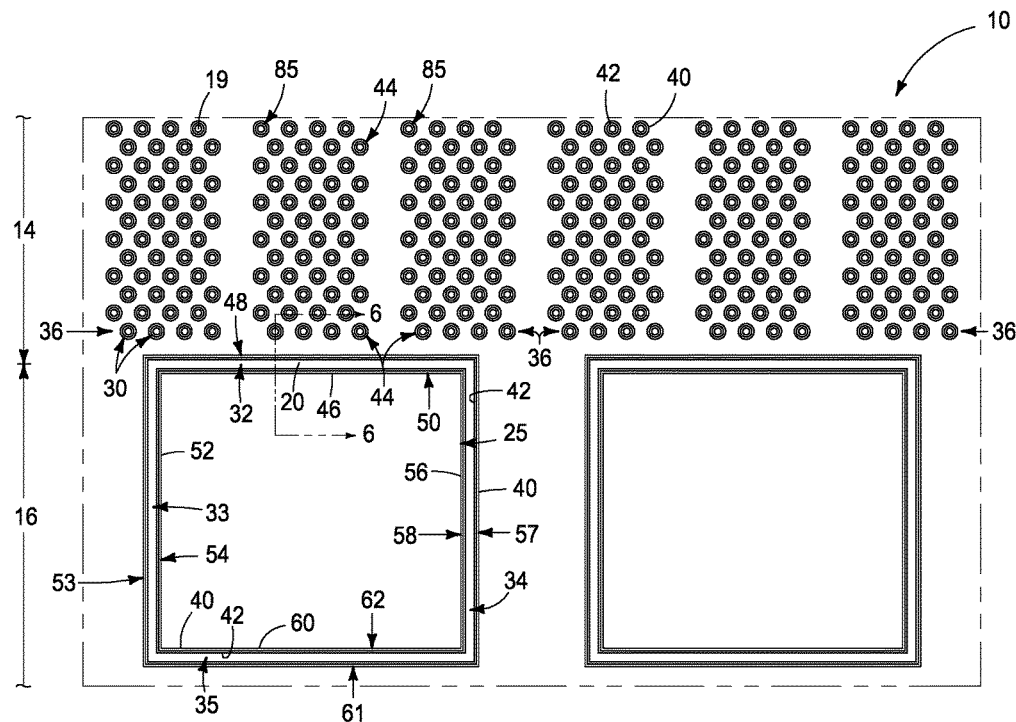
FIG. 5 is a view of the FIG. 3 construction at a processing step subsequent to that shown by FIG. 3.
Figure 6:
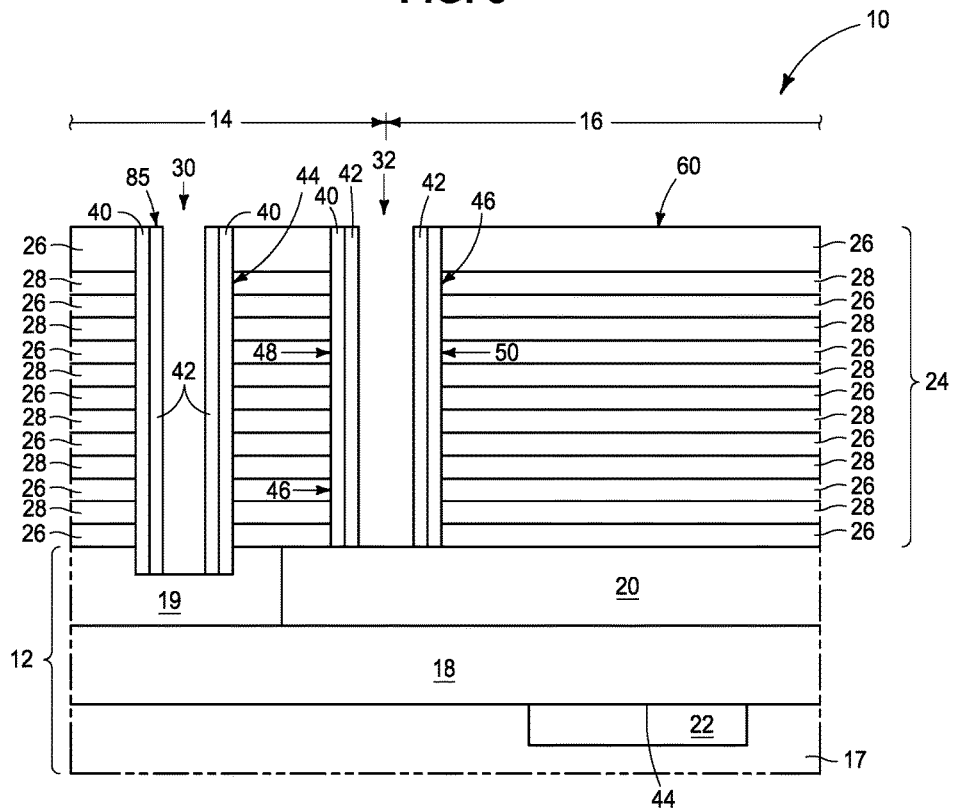
FIG. 6 is a sectional view taken through line 6-6 in FIG. 5.

Referring to FIGS. 5 and 6, materials 40 and 42 have been formed into channel openings 30 and wall opening 32, and in the depicted embodiment in wall openings 33, 34, and 35. Material 40 comprises programmable charge storage material and material 42 comprises semiconductive channel material. Example charge storage materials include any one or more of silicon nitride, ruthenium oxide, silicon oxynitride, nanodots, polysilicon, and silicon dioxide. Semiconductive channel material 42 (e.g., polysilicon) is suitably doped with conductivity enhancing impurity, with an example conductivity impurity doping range being from $5 \times 10^{17}$ atoms/cm$^3$ to $5 \times 10^{18}$ atoms/cm$^3$. In one embodiment and as shown, channel material 42 is formed as a hollow channel pillar 85 (FIG. 6) and ultimately may have dielectric material (not shown in FIGS. 5 and 6) formed radially-inward thereof. Alternately, non-hollow channels may be used.

Regardless, programmable charge storage material 40 and semiconductive channel material 42 form an elevationally-extending pillar 44 comprising the semiconductive channel material and the programmable charge storage material in individual channel openings 30 for individual of the elevationally-extending strings of memory cells being formed. Further, programmable charge storage material 40 and semiconductive channel material 42 in wall opening 32 form an elevationally-extending wall 46 (e.g., which may be in two separate parts at least at this point in the process, for example as shown) comprising a programmable charge storage material and the semiconductive channel material and which is horizontally along row 36 aside channel openings 30. Accordingly, wall 46 may have analogous attributes regarding dimension-extent, shape, and orientation that wall opening 32 has. Wall 46 may be considered as comprising a first side 48 facing pillars 44 and a second side 50 opposite first side 48 facing away from pillars 44. Analogously in the depicted embodiment, a second wall 52 comprising opposing sides 53, 54, a third wall 56 comprising opposing sides 57, 58, and a fourth wall 60 comprising opposing sides 61, 62 are also formed, and which comprise programmable charge storage material 40 and semiconductive channel material 42.

One or both, ideally both, of the programmable charge storage material and the semiconductive channel material is formed into the channel openings and into the wall opening at the same time. Semiconductive channel material 42 ideally directly electrically couples with source material 19. One technique to achieve such without providing a separate interconnect therefor, and as shown, includes first depositing programmable charge storage material 40 to line openings 30 and 32, followed by polish-back at least to the elevationally-outermost surface of the top layer of material 26, then wet dilute HF isotropic etch or anisotropic etch to remove material 40 from being centrally over the bases of openings 30 and 32. This is then followed by deposition of semiconductive channel material 42, polish-back thereof, and then etch to remove such from being centrally over the bases of openings 30 and 32. Alternately, semiconductive channel material 42 may not be removed (not shown) from being centrally over the bases of openings 30 and 32.

Ideally, material 40 includes a first-deposited control gate blocking insulator (e.g., $Al_2O_3$ and/or a silicon dioxide/silicon nitride/silicon dioxide composite) followed by deposition of the programmable charge storage material, and then followed by deposition of a tunnel insulator that will thereby be between the charge storage material and the semiconductive channel material. The tunnel insulator may comprise a composite of multiple different composition and thickness dielectric materials as will be appreciated by the artisan and is not material to the inventions disclosed herein. Regardless, in such event, wall 46 (and walls 52, 56, and 60) will also comprise the tunnel insulator and the control gate blocking insulator, with in one embodiment the control gate insulator forming the laterally-outermost surfaces of the respective walls on their opposing sides 48/50, 53/54, 57/58, and 61/62.

Figure 7:
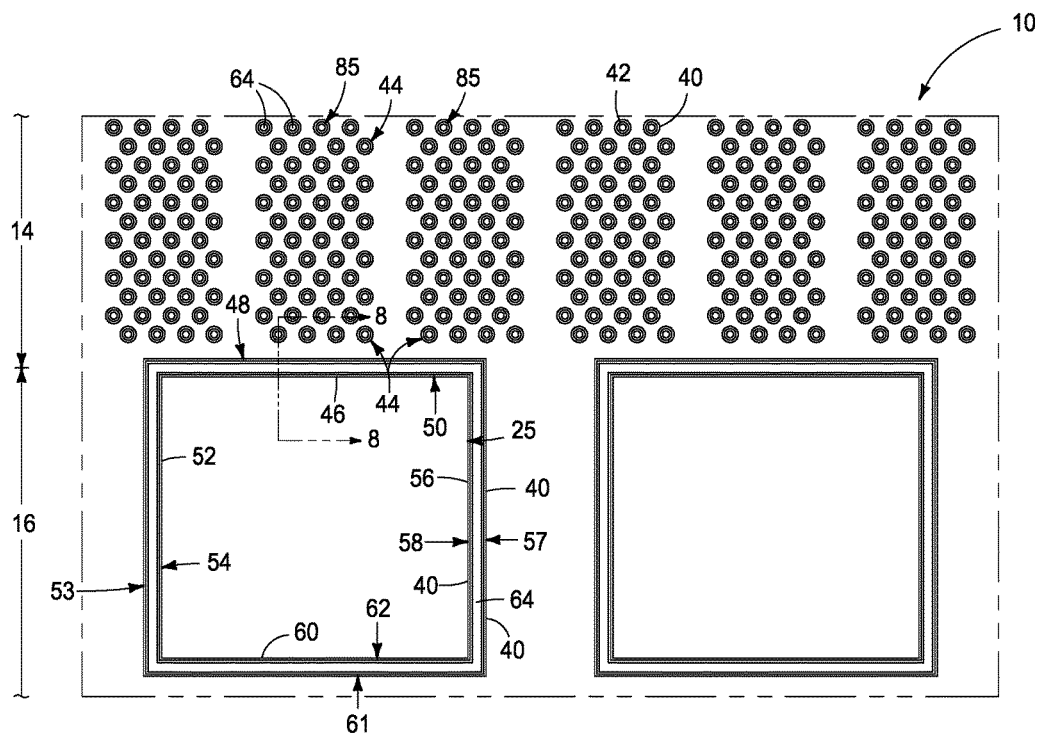
FIG. 7 is a view of the FIG. 5 construction at a processing step subsequent to that shown by FIG. 5.
Figure 8:
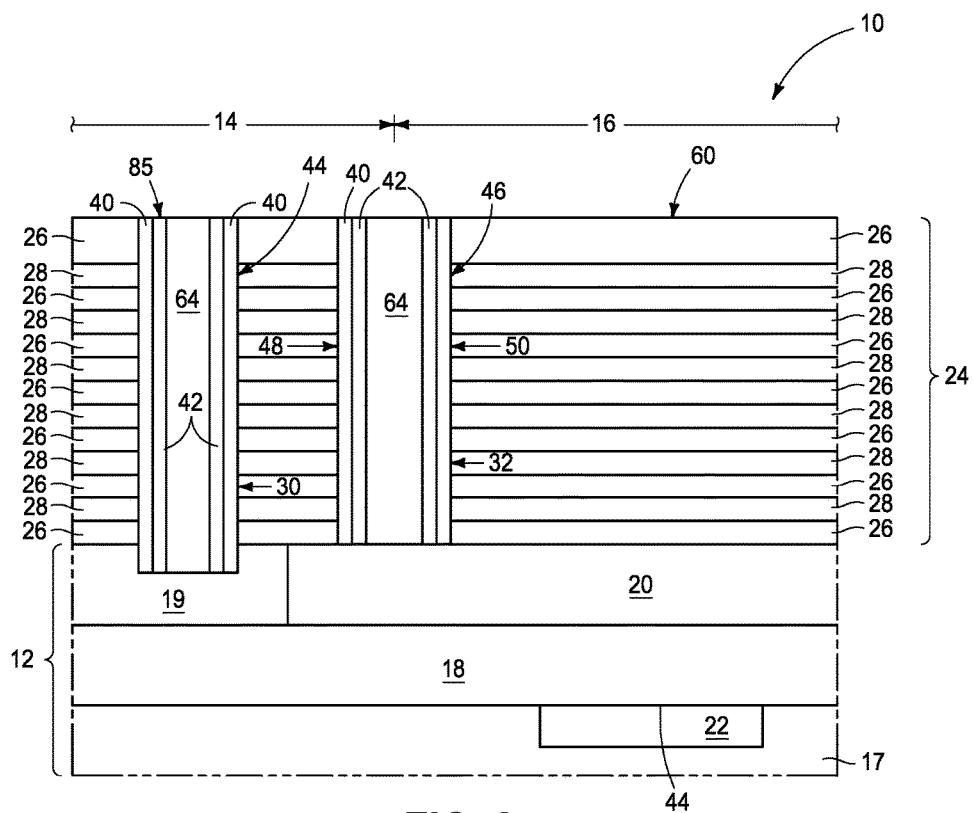
FIG. 8 is a sectional view taken through line 8-8 in FIG. 7.

Referring to FIGS. 7 and 8, dielectric material 64 (e.g., silicon nitride and/or doped or undoped silicon dioxide) has been deposited to fill remaining open volume of channel openings 30 and the wall openings, followed by planarizing such back at least to the elevationally-outermost surface of the top layer of material 26. Thus, in one embodiment, such forms wall 46 (and walls 52, 56, and 60) to comprise laterally outer linings of materials 40 and 42 and a central core comprising dielectric material 64. In one such embodiment, wall 46 (and walls 52, 56, and 60) comprises laterally-outermost linings of the control gate blocking insulator.

Figure 9:
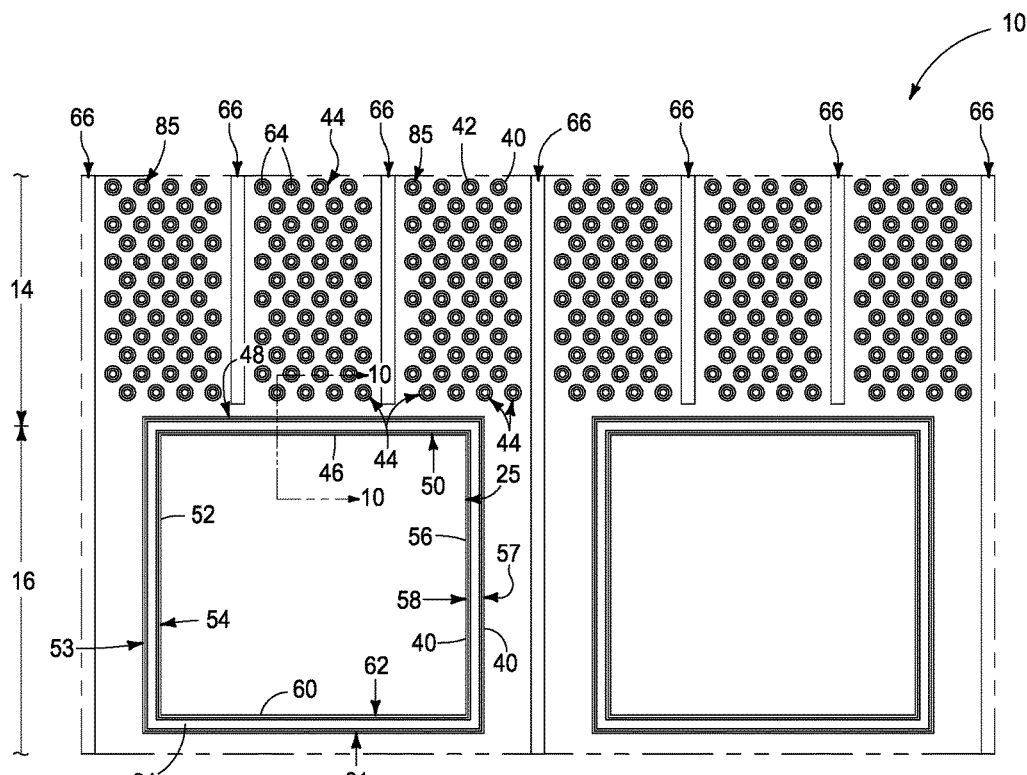
FIG. 9 is a view of the FIG. 7 construction at a processing step subsequent to that shown by FIG. 7.
Figure 10:
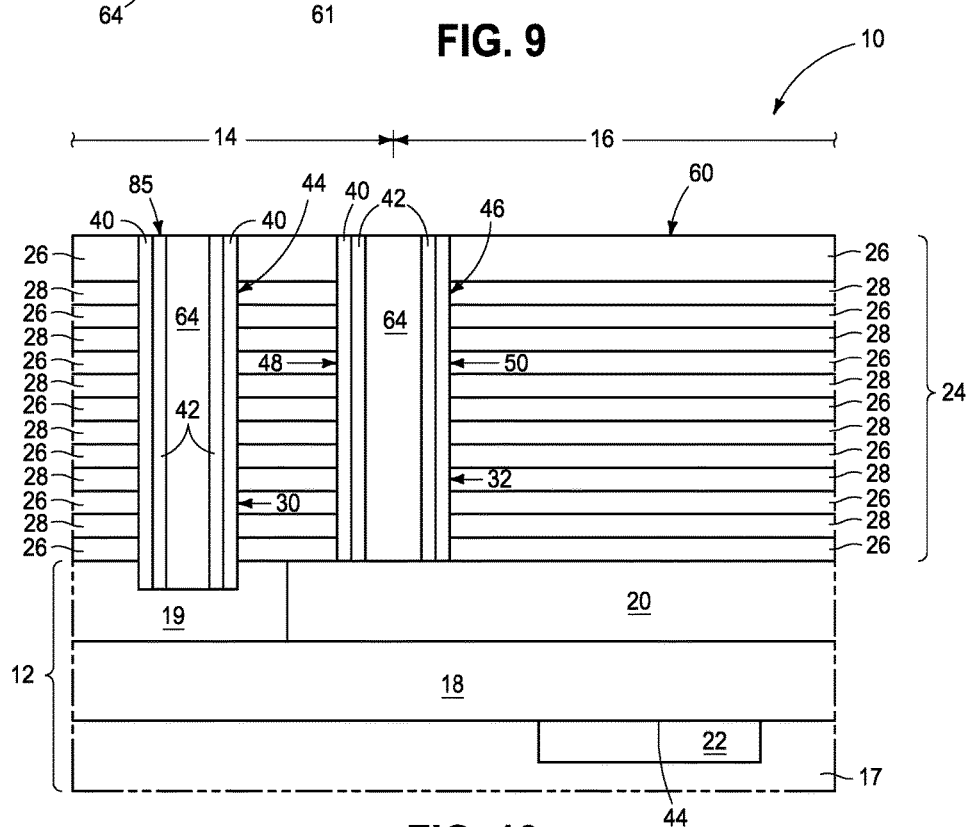
FIG. 10 is a sectional view taken through line 10-10 in FIG. 9.

Referring to FIGS. 9 and 10, access openings 66 (FIG. 9) have been formed through alternating tiers 26, 28 on first side 48 of wall 46. Access openings 66 provide access for etchant to subsequently contact the materials of alternating tiers 26, 28. Lateral edges of access openings 66 may also define lateral edges of access/control gate lines to be formed subsequently.

Figure 11:
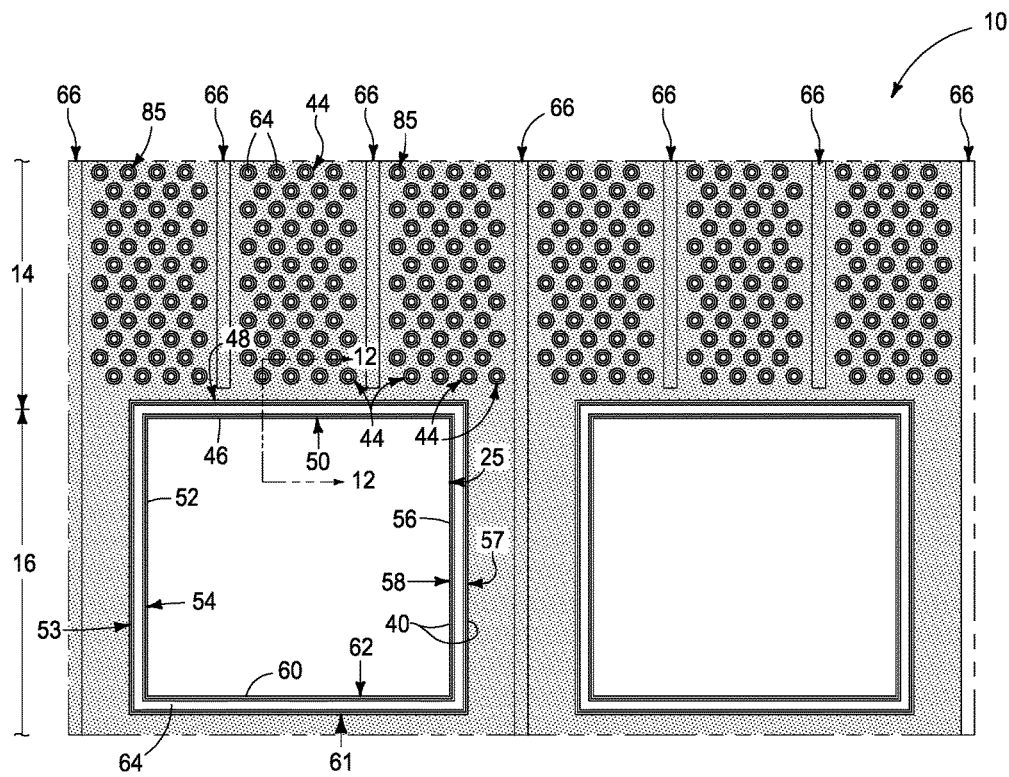
FIG. 11 is a view of the FIG. 9 construction at a processing step subsequent to that shown by FIG. 9.
Figure 12:
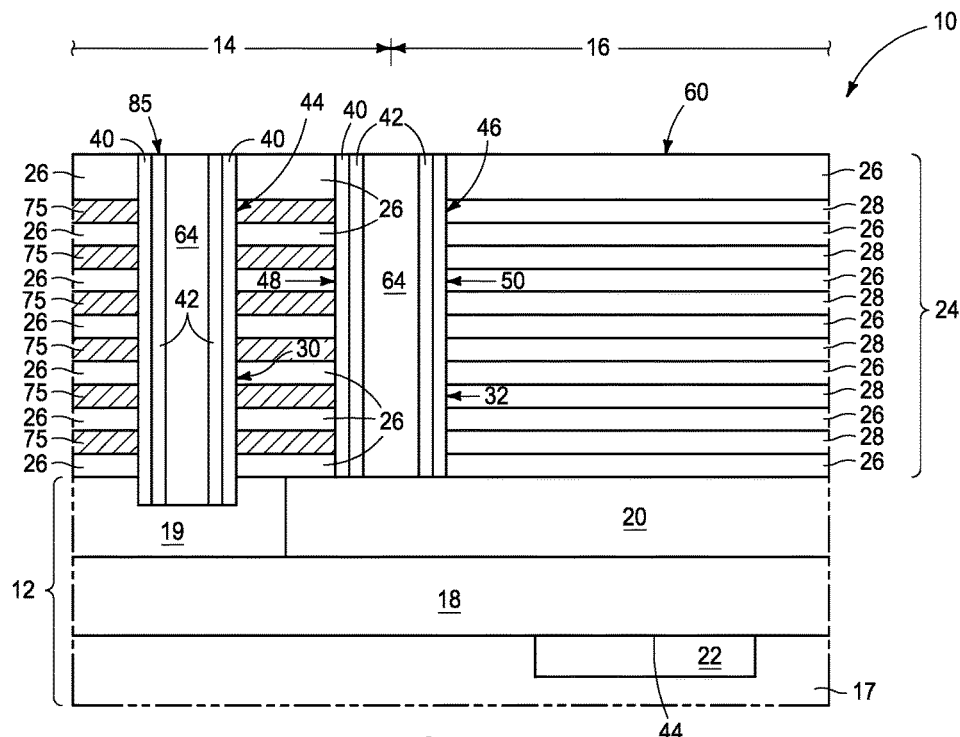
FIG. 12 is a sectional view taken through line 12-12 in FIG. 11.

Referring to FIGS. 11 and 12, isotropic etching has been conducted through access openings 66 of one of the different composition insulating materials (e.g., material 28 and which is not shown) that is between tiers of the other composition insulating material (e.g., material 26). Such may be conducted selectively of the one insulating material relative to the other insulating material. In this document, a selective etch or removal is an etch or removal where one material is removed relative to another stated material at a rate of at least 2:1. Wall 46 during such isotropic etching restricts lateral access of etching fluid from passing from first side 48 of wall 46 to second side 50 of wall 46. Further in the depicted embodiment, walls 52, 56, and 60 during such isotropic etching restrict lateral access of etching fluid from passing from first sides 53, 57, and 61, to second sides 54, 58, and 62, respectively.

Ideally, the isotropic etching is conducted selectively relative to at least some material of the wall(s), although not necessarily so. For example and by way of example only, the wall might be made of some material which is etched by the etchant at a rate greater than 1:2 although be sufficiently laterally thick to preclude etchant from passing from first side 48 to second side 50 with the wall itself being laterally etched, although not completely there-through. Accordingly and regardless, the wall may be laterally etched by the etchant whether or not it comprises a material that is etched at a rate of less than 1:2 relative to etching of the other material (e.g., material 28 in the depicted embodiment). In the depicted embodiment and where a selective etch is conducted as described in the preceding paragraph, the material of wall 46 that material 28 is etched selectively relative thereto may or may not comprise the programmable charge storage material and/or the semiconductive channel material. For example and by way of example only, where wall 46 comprises an outer lining of control gate blocking insulator, that insulator may block the etchant from reaching the programmable charge storage material.

After the etching of material 28, FIGS. 11 and 12 show deposition of conductive control gate material 75, effectively replacing the removed insulating material (e.g., material 28, which is not shown). Control gate material 75 is shown as peppering in FIG. 11 and subsequent top views for clarity of lateral extent of such material in one embodiment. However, such would not literally be viewable in the top views at least because of top layer 26 being there-over except within access openings 66 in FIG. 11. In one embodiment and as shown, the replacing of the insulating material (e.g., 28) with control gate material 75 results in individual tiers of control gate material 75 being directly against wall 46 on first wall side 48. Likewise, control gate material 75 may also be directly against side 53 of wall 52, side 57 of wall 56, and side 61 of wall 60. Regardless and in one embodiment, control gate material 75 is not directly against either of the programmable charge storage material or the semiconductive channel material of wall 46. For example and by way of example only, and as described with respect to one example embodiment above, the control gate blocking insulator may be between the programmable charge storage material and the control gate material, and in one embodiment the control gate material may be directly against the control gate blocking insulator of wall 46 on first wall side 48, and analogously so with respect to walls 52, 56, and 60.

Figure 13:
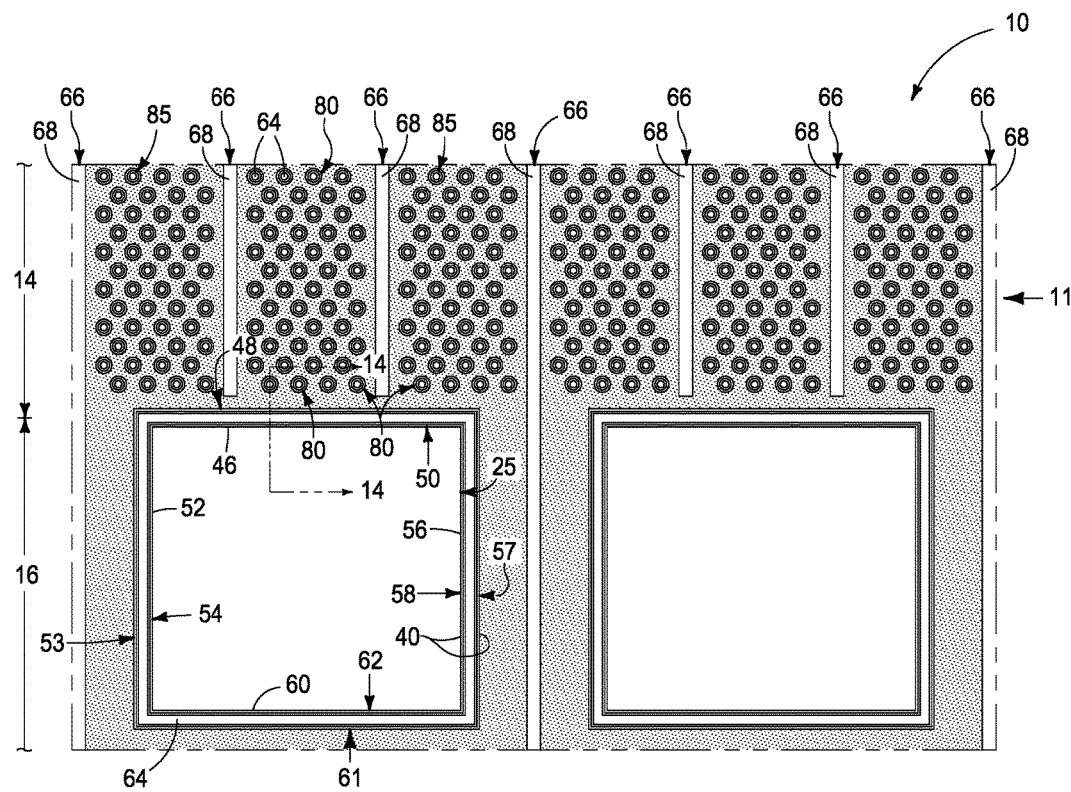
FIG. 13 is a view of the FIG. 11 construction at a processing step subsequent to that shown by FIG. 11.
Figure 14:
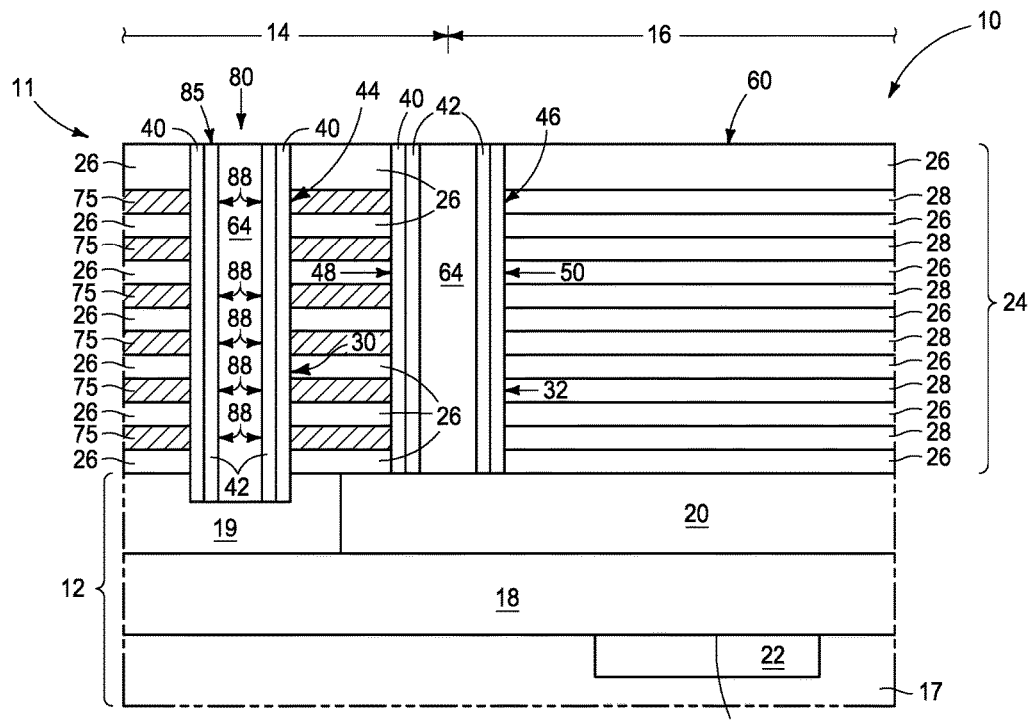
FIG. 14 is a sectional view taken through line 14-14 in FIG. 13.

Referring to FIGS. 13 and 14, control gate material 75 has been removed from access openings 66 (e.g., by anisotropic selective etch relative to materials 26, 40, 42, and 64). Dielectric material 68 (e.g., silicon nitride and/or silicon dioxide) has then been deposited into access openings 66 and planarized back to fill access openings 66, thus forming an array 11 of elevationally-extending strings 80 of individual memory cells 88. Construction 10 is shown as comprising a single memory cell 88 about the channel pillar in each tier of the elevationally-extending strings of memory cells. Alternately, and by way of example only, any existing or yet-to-be-developed construction may be used wherein two or more memory cells are circumferentially spaced about the channel pillar in a single tier in a given string (not shown).

Figure 15:
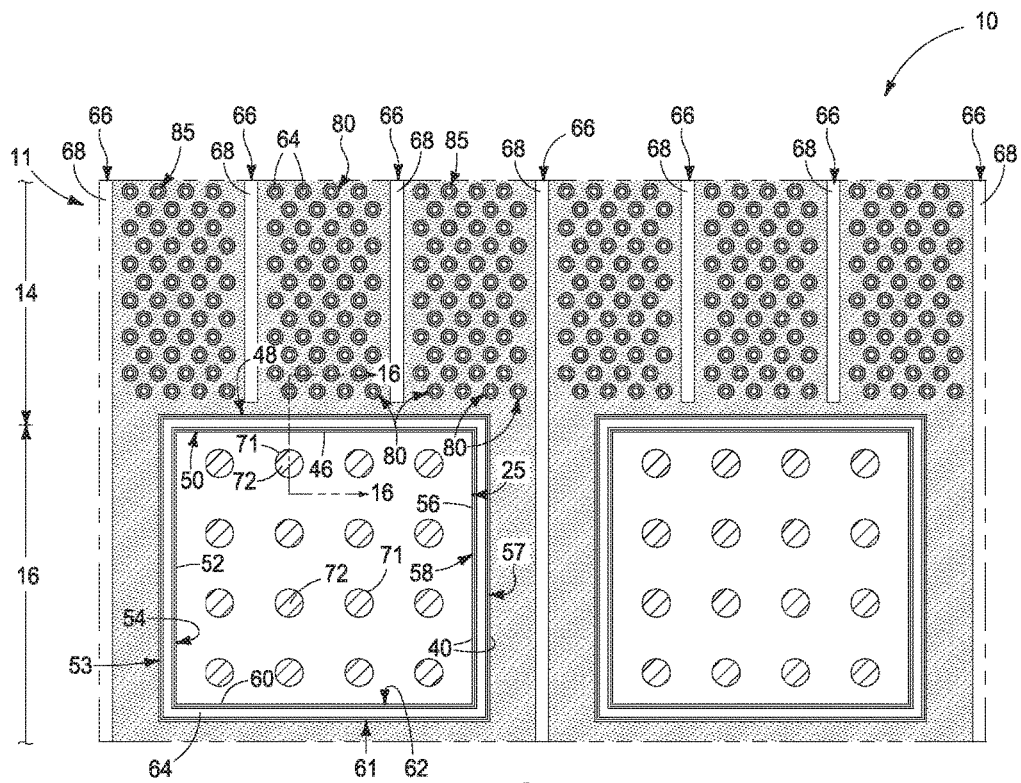
FIG. 15 is a view of the FIG. 13 construction at a processing step subsequent to that shown by FIG. 13.
Figure 16:
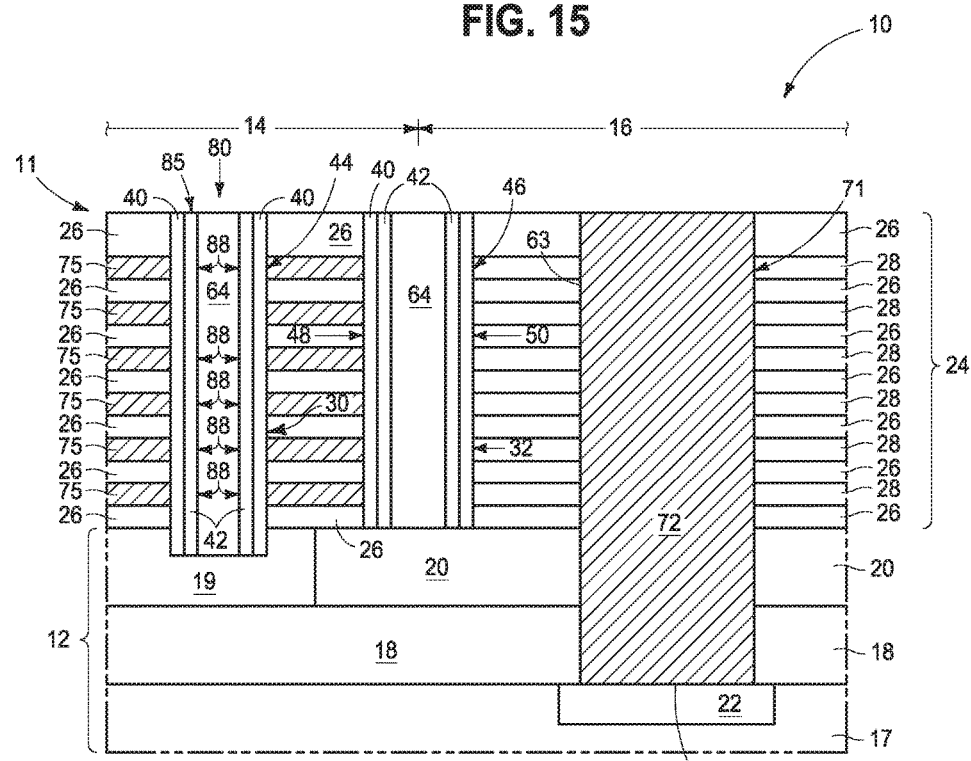
FIG. 16 is a sectional view taken through line 16-16 in FIG. 15.

Referring to FIGS. 15 and 16, elevationally-extending conductive via openings 71 have been formed through alternating tiers 26, 28 of different composition insulating materials on second wall side 50 of wall 46. In but one example, via openings 71 may be substantially circular having a maximum horizontal open dimension at their respective elevationally-outermost portions which is greater than that of channel openings 30, for example from about 2,000 Angstroms to 4,000 Angstroms and which may also taper (not shown) to a horizontal open dimension which is less at their elevationally-innermost portions where meeting with conductive region 22. Via openings 71 have been filled with conductive material to form conductive vias 72. At least some of conductive vias 72 may be through-array vias (TAV's) (as shown) which extend to memory array control and/or read/write circuitry (not shown, but for region 22) constructed below array 11. Formation of TAV's (e.g., 72) may be conducted commensurate with forming of conductive vias (not shown) that connect to staircase steps (not shown) of individual control gate lines of the respective tiers, and regardless of whether on side 50 of wall 46. Alternately, TAV's and other conductive vias (not shown) may be formed at separate times.

Access openings 66 enable etchant to access and remove material 28 by selective etching relative to material 26 in the depicted example. In addition to material 28 being removed by the etchant laterally (e.g., in the "x" direction of the drawings) between access openings 66, it is also removed longitudinally outward from the ends of access openings 66 (e.g., in the "y" direction of the drawings). Removed material 28 is replaced by conductive control gate material 75. This material should not touch a conductive via 72 lest an undesired short between the two occur. In previous methods before this invention, the conductive vias had to be sufficiently spaced away laterally and longitudinally from access openings 66 to enable some of material 28 at the conclusion of a timed etch of material 28 to remain laterally aside where conductive vias 72 will be. Use of a wall 46 (and walls 52, 56, 60) may enable reduction of such lateral and longitudinal spacing between access openings 66 and conductive vias 72, thus increasing circuit density. Also, only one or more walls 46 may be used (e.g., in the absence of walls 52, 56, and/or 60) which may enable reduction of such longitudinal spacing but perhaps not such lateral spacing. Regardless, while the invention was so-motivated, it is not so-limited unless so-stated in a claim under analysis.

Figure 17:
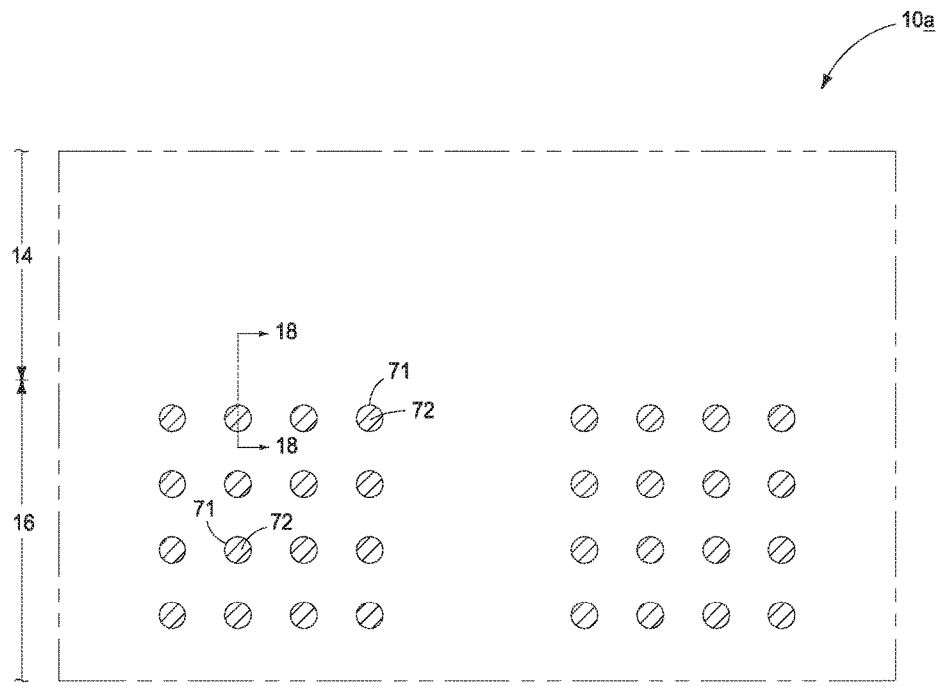
FIG. 17 is a diagrammatic top plan view of a construction comprising an array of elevationally-extending strings of memory cells in fabrication in accordance with an embodiment of the invention.
Figure 18:
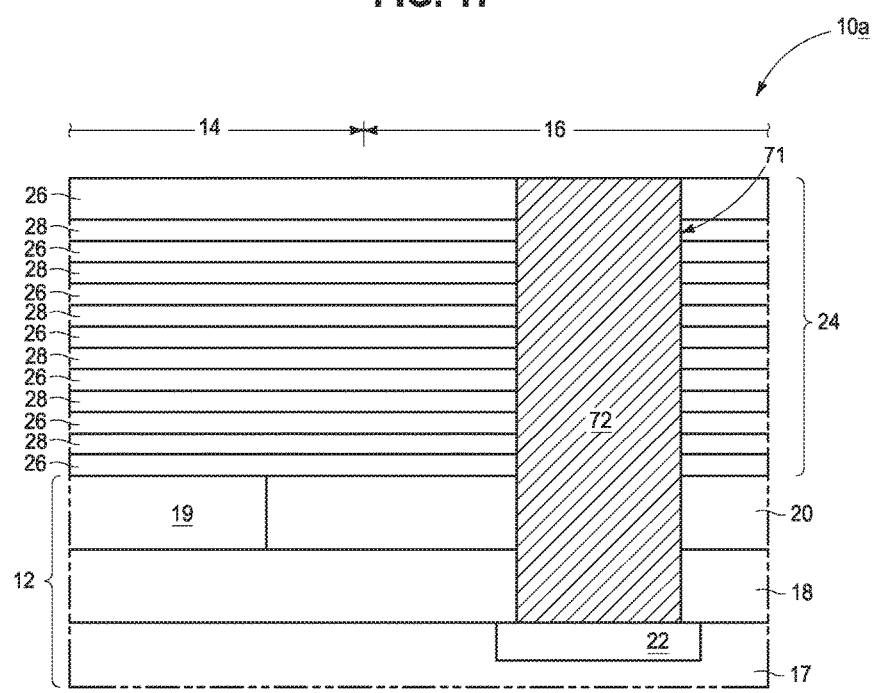
FIG. 18 is a sectional view taken through line 18-18 in FIG. 17.

The above-described processing shows provision of conductive vias 72 after the etching shown by FIG. 9. Alternately by way of example, formation of conductive vias 72 may occur before the etching depicted by FIG. 9, including before or after forming either wall opening 32 or wall 46 and as well before or after forming channel openings 30 and pillars 44. For example and by way of example only, FIGS. 17 and 18 show processing relative to an alternate construction 10*a*. Like numerals from the above-described embodiments have been used where appropriate, with some construction differences being indicated with the suffix "a". FIGS. 17 and 18 show an example embodiment wherein via openings 71 and conductive vias 72 have been formed prior to forming any of the structure shown in FIGS. 3 and 4 in the above-described embodiments.

Embodiments of the invention include an array of elevationally-extending strings of memory cells independent of method of manufacture wherein the memory cells individual comprise a programmable charge storage transistor. Nevertheless, such an array may comprise any of structural aspect described above with respect to method embodiments. Regardless, such an array will comprise a substrate (e.g., construction 10/10*a*) comprising a first region (e.g., 14) containing memory cells (e.g., 88) and a second region (e.g., 16) not containing memory cells and which is laterally of the first region. The first region comprises vertically-alternating tiers of insulative material (e.g., 26) and control gate material (e.g., 75). The second region comprises vertically-alternating tiers of different composition insulating materials (e.g., 26, 28) laterally of the first region.

A channel pillar (e.g., 85) comprising semiconductive channel material extends elevationally through multiple of the vertically-alternating tiers within the first region. Tunnel insulator, programmable charge storage material, and control gate blocking insulator are between the channel pillar and the control gate material of individual of the tiers of control gate material within the first region. Conductive vias (e.g., 72) extend elevationally through the vertically-alternating tiers in the second region. An elevationally-extending wall (e.g., 46) is laterally between the first and second regions. The wall comprises the programmable charge storage material and the semiconductive channel material. Any other attribute(s) or aspect(s) as shown and/or described above may be used.

For example and by way of examples only, in one embodiment the wall is laterally spaced from a row of channel pillars and extends along the row aside multiple of the channel pillars in the row. In one such embodiment, the wall extends along at least four channel pillars in the row, in one such embodiment the wall is parallel with the row, in one such embodiment the wall is horizontally straight-linear, and in one such embodiment the wall is horizontally straight-linear and the wall is parallel with the row. In one embodiment, an elevationally-extending wall (e.g., 46, 52, 56, 60 in combination) completely encircles an island (e.g., 25) comprising the conductive vias, where the wall comprises the programmable charge storage material and the semiconductive channel material, and in one embodiment also comprises the tunnel insulator and the control gate blocking insulator. Again, any other attribute(s) or aspect(s) as shown and/or described above may be used.

CONCLUSION

In some embodiments, a method of forming an array of elevationally-extending strings of memory cells, where the memory cells individually comprise a programmable charge storage transistor, comprises forming a stack comprising vertically-alternating tiers of different composition insulating materials. Elevationally-extending channel openings are formed through the alternating tiers and an elevationally-extending wall opening is formed through the alternating tiers. The wall opening is laterally spaced from a row of the channel openings and extends horizontally along the row aside the channel openings. Programmable charge storage material and semiconductive channel material are formed into the channel openings and into the wall opening to form an elevationally-extending pillar comprising the semiconductive channel material and the programmable charge storage material in individual of the channel openings for individual of the elevationally-extending strings and to form an elevationally-extending wall in the wall opening. The wall comprises the programmable charge storage material and the semiconductive channel material and extends horizontally along the row aside the channel openings. The wall comprises a first side facing the pillars and a second side opposite the first side facing away from the pillars. After forming the wall, access openings are formed through the alternating tiers of different composition insulating materials on the first side of the wall. Isotropic etching is conductive of one of the different composition insulating materials through the access openings and that is between the tiers of the other composition insulating material. The one insulating material is replaced with control gate material for the memory cells on the first side of the wall. The wall during the isotropic etching restricts lateral access of etching fluid from passing from the first side of the wall to the second side of the wall. Elevationally-extending conductive vias are ultimately provided through the alternating tiers of different composition insulating materials on the second side of the wall.

In some embodiments, an array of elevationally-extending strings of memory cells, where the memory cells individually comprise a programmable charge storage transistor, comprises a substrate comprising a first region containing memory cells and a second region not containing memory cells laterally of the first region. The first region comprises vertically-alternating tiers of insulative material and control gate material. The second region comprises vertically-alternating tiers of different composition insulating materials laterally of the first region. A channel pillar comprising semiconductive channel material extends elevationally through multiple of the vertically-alternating tiers within the first region. Tunnel insulator, programmable charge storage material, and control gate blocking insulator are between the channel pillar and the control gate material of individual of the tiers of the control gate material within the first region. Conductive vias extend elevationally through the vertically-alternating tiers in the second region. An elevationally-extending wall is laterally between the first and second regions. The wall comprises the programmable charge storage material and the semiconductive channel material.

In some embodiments, an array of elevationally-extending strings of memory cells, where the memory cells individually comprise a programmable charge storage transistor, comprises a substrate comprising a first region containing memory cells and a second region not containing memory cells laterally of the first region. The first region comprises vertically-alternating tiers of insulative material and control gate material. The second region comprises vertically-alternating tiers of different composition insulating materials laterally of the first region. A channel pillar comprising semiconductive channel material extends elevationally through multiple of the vertically-alternating tiers within the first region. Tunnel insulator, programmable charge storage material, and control gate blocking insulator are between the channel pillar and the control gate material of individual of the tiers of the control gate material within the first region. Conductive vias extend elevationally through the vertically-alternating tiers in the second region. An elevationally-extending wall completely encircles an island comprising the conductive vias. The wall comprises the programmable charge storage material and the semiconductive channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of elevationally-extending strings of memory cells, the memory cells individually comprising a programmable charge storage transistor, the array comprising:
   a substrate comprising a first region containing memory cells and a second region not containing memory cells laterally of the first region, the first region comprising vertically-alternating tiers of insulative material and control gate material, the second region comprising vertically-alternating tiers of different composition insulating materials laterally of the first region;
   a channel pillar comprising semiconductive channel material extending elevationally through multiple of the vertically-alternating tiers within the first region;
   tunnel insulator, programmable charge storage material, and control gate blocking insulator between the channel pillar and the control gate material of individual of the tiers of the control gate material within the first region;
   conductive vias extending elevationally through the vertically-alternating tiers in the second region; and
   an elevationally-extending wall laterally between the first and second regions, the wall comprising the programmable charge storage material and the semiconductive channel material.

2. The array of claim 1 wherein the wall is laterally spaced from a row of the channel pillars and extends along the row aside multiple of the channel pillars in the row.

3. The array of claim 2 wherein the wall extends along at least four channel pillars in the row.

4. The array of claim 2 wherein the wall is parallel with the row.

5. The array of claim 2 wherein the wall is horizontally straight-linear.

6. The array of claim 1 wherein individual tiers of the control gate material are directly against the wall on a first region-side of the wall.

7. The array of claim 6 wherein the control gate material is not directly against either of the programmable charge storage material or the semiconductive channel material of the wall.

8. The array of claim 1 wherein the wall comprises the tunnel insulator and the control gate blocking insulator.

9. The array of claim 8 wherein individual tiers of the control gate material are directly against the control gate blocking insulator of the wall on a first region-side of the wall.

10. The array of claim 1 wherein the wall comprises laterally outer linings of the programmable charge storage material and the semiconductive channel material and a central core comprising dielectric material.

11. The method of claim 10 wherein the wall comprises laterally-outermost linings of the control gate blocking insulator.

12. The array of claim 1 wherein, the wall is a first wall; and
   further comprising:
      a second elevationally-extending wall comprising the programmable charge storage material and the semiconductive channel material, the second wall angling relative to the first wall.

13. The array of claim 12 wherein the second wall joins with the first wall and comprises an angling extension of the first wall.

14. An array of elevationally-extending strings of memory cells, the memory cells individually comprising a programmable charge storage transistor, the array comprising:
   a substrate comprising a first region containing memory cells and a second region not containing memory cells laterally of the first region, the first region comprising vertically-alternating tiers of insulative material and control gate material, the second region comprising vertically-alternating tiers of different composition insulating materials laterally of the first region;
   a channel pillar comprising semiconductive channel material extending elevationally through multiple of the vertically-alternating tiers within the first region;
   tunnel insulator, programmable charge storage material, and control gate blocking insulator between the channel pillar and the control gate material of individual of the tiers of the control gate material within the first region;

conductive vias extending elevationally through the vertically-alternating tiers in the second region; and an elevationally-extending wall completely encircling an island comprising the conductive vias, the wall comprising the programmable charge storage material and the semiconductive channel material.

15. The array of claim 5 wherein the row is horizontally straight-linear, the wall being parallel with the row.

16. The array of claim 1 wherein the wall is vertical or within 10° of vertical.

17. An array of elevationally-extending strings of memory cells, the memory cells individually comprising a programmable charge storage transistor, the array comprising:

a substrate comprising a first region containing memory cells and a second region not containing memory cells laterally of the first region, the first region comprising vertically-alternating tiers of insulative material and control gate material, the second region comprising vertically-alternating tiers of different composition insulating materials laterally of the first region;

a channel pillar comprising semiconductive channel material extending elevationally through multiple of the vertically-alternating tiers within the first region;

programmable charge storage material between the channel pillar and the control gate material of individual of the tiers of the control gate material within the first region;

conductive vias extending elevationally through the vertically-alternating tiers in the second region; and an elevationally-extending wall laterally between the first and second regions, the wall comprising the programmable charge storage material and the semiconductive channel material.

18. An array of elevationally-extending strings of memory cells, the memory cells individually comprising a programmable charge storage transistor, the array comprising:

a substrate comprising a first region containing memory cells and a second region not containing memory cells laterally of the first region, the first region comprising vertically-alternating tiers of insulative material and control gate material, the second region comprising vertically-alternating tiers of different composition insulating materials laterally of the first region;

a channel pillar comprising semiconductive channel material extending elevationally through multiple of the vertically-alternating tiers within the first region;

programmable charge storage material between the channel pillar and the control gate material of individual of the tiers of the control gate material within the first region;

conductive vias extending elevationally through the vertically-alternating tiers in the second region; and an elevationally-extending wall completely encircling an island comprising the conductive vias, the wall comprising the programmable charge storage material and the semiconductive channel material.

* * * * *